United States Patent [19]
Taricco

[11] Patent Number: 5,415,193
[45] Date of Patent: May 16, 1995

[54] PRESSURE CONTROLLED CLEANING SYSTEM

[76] Inventor: Todd Taricco, 1275 Lincoln Park Cir., Cave Rock, Lake Tahoe, Nev. 89448

[21] Appl. No.: 975,798

[22] Filed: Nov. 13, 1992

[51] Int. Cl.⁶ .............................................. B08B 3/10
[52] U.S. Cl. ................................ 134/107; 134/108; 134/200; 68/18 C
[58] Field of Search ............... 220/240; 202/269, 242; 134/107, 108, 105, 12, 21, 200; 68/18 C, 18 R; 277/3, 15

[56] References Cited

U.S. PATENT DOCUMENTS

| | | | |
|---|---|---|---|
| 3,593,727 | 7/1971 | Black | 134/107 X |
| 3,896,829 | 7/1975 | Sabatka | 134/107 X |
| 4,055,196 | 10/1977 | Kearney | 134/107 |
| 4,141,373 | 2/1979 | Kartanson | 134/105 |
| 4,290,439 | 9/1981 | Charpentier | 134/107 |
| 4,425,949 | 1/1984 | Rowe, Jr. | 134/21 |
| 4,698,130 | 10/1987 | Restall et al. | 134/21 X |
| 4,781,041 | 11/1988 | Fowler | 88/18 R |
| 4,838,476 | 6/1989 | Rahn | 134/108 |
| 4,871,417 | 10/1989 | Nishizawa et al. | 134/21 X |
| 5,045,117 | 9/1991 | Witherell | 134/107 X |
| 5,051,135 | 9/1991 | Tanaka et al. | 134/12 |
| 5,082,535 | 1/1992 | Oesch et al. | 134/108 X |
| 5,126,077 | 6/1992 | Morikawa et al. | 134/12 X |
| 5,158,100 | 10/1992 | Tanaka et al. | 134/109 |

FOREIGN PATENT DOCUMENTS

| | | | |
|---|---|---|---|
| 301104 | 3/1964 | Netherlands | 134/108 |
| 585890 | 12/1977 | U.S.S.R. | 134/108 |

*Primary Examiner*—Frankie L. Stinson
*Attorney, Agent, or Firm*—Blakely, Sokoloff, Taylor & Zafman

[57] ABSTRACT

A cleaning system which includes a tank that contains a cleaning fluid. The cleaning fluid is typically in either a liquid, vapor or two-phase state, and is capable of removing grease and other foreign material from an object such as a circuit board. The tank has a heating jacket that provides heat to the cleaning fluid to raise the fluid to the vaporized state. A still is coupled to the tank by a vacuum pump. The pump circulates both liquid and vaporized cleaning fluid through the still which removes the foreign material from the fluid. The system has a pressure control system which controls the pressure of the cleaning fluid within the tank. The vacuum pump and pressure control system insure that the cleaning fluid is maintained in a desired state. The vacuum pump typically reduces the pressure of the cleaning fluid below the operating level of a conventional cleaning tank. The reduction in operating pressure provides a corresponding decrease in the saturation temperature of the cleaning fluid.

19 Claims, 1 Drawing Sheet

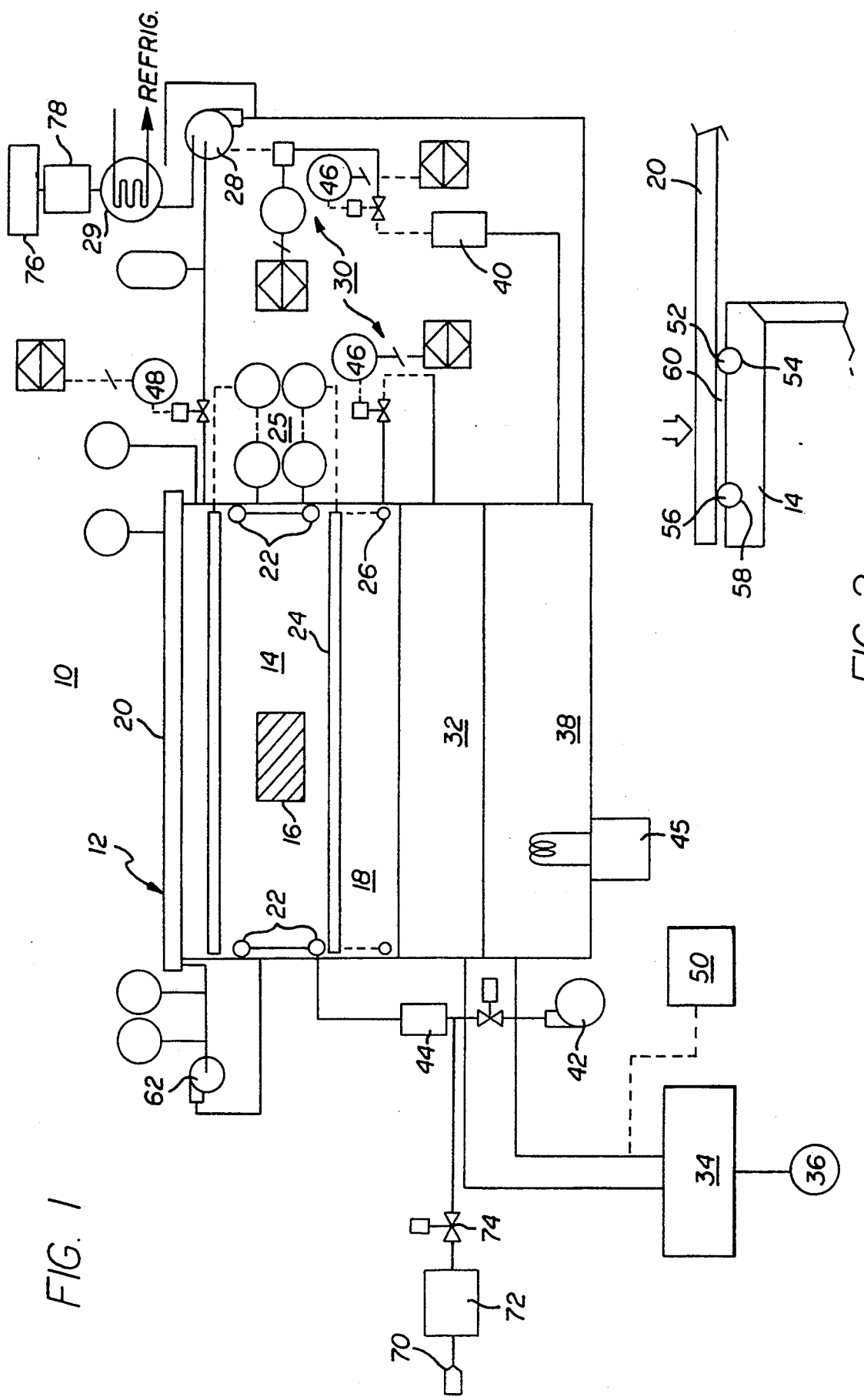

PRESSURE CONTROLLED CLEANING SYSTEM

BACKGROUND OF THE INVENTION

1. Field of the Invention

The present invention relates to a cleaning system that utilizes a cleaning fluid to remove grease and other foreign debris such as flux from an object.

2. Description of Related Art

It is sometimes desirable to remove grease, oils, flux and other foreign debris from an object. For example, electronic circuit boards are typically de-greased before insertion into a solder machine. The de-greasing process insures better adhesion of the solder to the board, thereby improving the life of the solder joint.

Cleaning and de-greasing operations are typically performed in a closed tank. The tank usually contains a vaporized cleaning agent such as a chlorofluorocarbon, trichloroethylene or methyl chloride. The use of conventional de-greasing tanks typically results in the release of solvent vapors into the atmosphere. It is now known that conventional de-greasing chemicals such as chlorofluorocarbons, deplete the ozone and produce other negative environmental side effects.

U.S. Pat. No. 5,106,404 issued to Grant discloses a cleaning system that evacuates the solvent from the cleaning chamber before the lid and part are removed from the tank. Although effective in reducing the release of solvents, the solvents can still escape through the interface between the lid and the tank. It would therefore be desirable to have a seal system between the lid and tank to insure that the vaporized cleaning agent does not escape the cleaning chamber and contaminate the environment.

Conventional cleaning systems typically maintain the cleaning solvent in a vaporized state. The Grant patent discloses a cleaning system which cycles the pressure of the cleaning chamber so that the solvent goes through a number of vaporizing and condensing cycles. Such a process has been found to remove contaminants embedded in the part. The pressure cycling process disclosed in Grant requires additional logic circuitry and increases the cycle time needed to clean the part. It would be desirable to provide a cleaning system and process that increases the aggressiveness of the cleaning fluid without cycling the system. It would also be desirable to provide a system that can use an aggressive non-toxic cleaning fluid.

SUMMARY OF THE INVENTION

The present invention is a cleaning system which includes a tank that contains a cleaning fluid. The cleaning fluid is typically in either a liquid, vapor or two-phase state, and is capable of removing grease and other foreign material from an object such as a circuit board or a precision part. The tank has a heating jacket that provides heat to the cleaning fluid to maintain the fluid in a desired state. The tank also has a manifold to introduce fluid to the chamber in a liquid state. A still is coupled to the tank by a vacuum pump. The pump circulates both liquid and vaporized cleaning fluid through the still, which removes the foreign material from the fluid. The foreign material is stored in a waste container that can be removed to allow easy disposal of the waste product. The cleaning fluid may flow from the still through a condensing/reheating cycle before being reintroduced to the tank.

The system has a pressure control system which controls the pressure of the cleaning fluid within the tank. The vacuum pump and pressure control system insure that the cleaning fluid is maintained in the desired state. The vacuum pump typically varies the pressure of the cleaning fluid from the operating level of a conventional cleaning tank. The variation in operating pressure provides a corresponding change in the saturation temperature of the cleaning fluid. The system is therefore capable of maintaining the fluid in a desired state at a temperature other than a conventional cleaning system. It has been found that certain previously incompatible chemicals can be used as cleaning agents at lower or higher operating temperatures depending upon the pressure of the agent. For example, trichloroethylene, which historically attacks plastics and other materials at conventional operating temperatures, can safely and effectively clean objects such as an electronic circuit board using the present invention.

The system may have a large reservoir and an additional vacuum pump. The additional components may allow the user to evacuate the cleaning fluid from the tank and store the fluid in the reservoir. The cleaning fluid may then be reintroduced to the cleaning tank using the existing equipment of the system. The present invention utilizes an essentially closed system so that the cleaning fluid is removed and supplied to the tank without introducing oxygen into the system. The present system is therefore less susceptible to explosion when used with a flammable cleaning fluid.

Between the lid and the tank are a pair of seals that are separated by a channel. The channel is connected to a compressor, which creates a vacuum and maintains the lid in contact with the seals and tank. The dual seal assembly significantly reduces the possibilities of the cleaning fluid escaping into the atmosphere.

It is therefore an object of the present invention to provide a cleaning system that can be used with toxic or environmentally damaging chemicals without discharging or otherwise exposing the environment to the chemicals.

It is also an object of the present invention to provide a cleaning system that can control the pressure of the cleaning fluid, to vaporize the cleaning fluid to a temperature, lower or higher than the vapor temperature of conventional cleaning solvents and processes.

It is also an object of the present invention to provide a cleaning system that allows the tank to be completely evacuated of cleaning fluid.

It is also an object of the present invention to provide a cleaning system with flammable materials, that can allow cleaning fluid to be evacuated and resupplied to a cleaning tank without the introduction of oxygen.

It is also an object of the present invention to provide a seal assembly that seals a lid to a tank to prevent the cleaning fluid from escaping into the atmosphere.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a schematic of a cleaning system of the present invention;

FIG. 2 is a cross-sectional view of a lid sealed to a cleaning tank.

DETAILED DESCRIPTION OF THE INVENTION

Referring to the drawings more particularly by reference numbers, FIG. 1 shows a cleaning system 10 of the present invention. The system 10 has a tank 12 constructed to enclose a cleaning chamber 14. The cleaning chamber 14 is adapted to hold an object 16 such is an electronic circuit board or a precision part. The object 16 typically contains grease and other foreign material that is removed by a cleaning fluid 18 within the tank 12. Although the cleaning of a circuit board or precision part 16 are described, it is to be understood that the present invention can be used to clean other objects. For example, the system 10 may be used to clean clothing or other fabrics. The tank 12 typically has a lid 20 that provides access to the cleaning chamber 14 and allows the object to be inserted and removed from the container 12.

The cleaning fluid 18 within the tank 12 may be in a liquid, vapor or two-phase state. The cleaning fluid 18 is preferably introduced into the tank 12 by a first manifold 22 that extends across the chamber 14. As an alternate embodiment, the manifold 22 may extend around the periphery of the chamber 14 to allow the object to be inserted from the top of the tank 12. Heating elements 24 may be incorporated into the walls of the container 12 and coupled to heating control logic 25. The heating elements 24 may be constructed to also provide radiant heat. The heating elements 24 provide additional heat to the cleaning fluid 18 and object 16 and maintain the fluid in the desired state. The tank 12 may also have a second manifold 26 that extends across the chamber 14 and supplies cleaning fluid 18 in a liquid state. Like the first manifold 22, the second manifold 26 may extend around the periphery of the tank 12. The manifold 26 is preferably constructed so that the cleaning fluid 18 is introduced into the chamber 14 as a liquid spray. The second manifold 26 may be used in conjunction with the first manifold 22, or as an alternative to the manifold 22.

A first vacuum pump 28 is coupled to the tank 12. The pump 28 is preferably a liquid ring pump that is capable of reducing the pressure within the chamber 14. The liquid ring pump utilizes a supercooled fluid which is pumped through a heat exchanger 29 that is coupled to a refrigeration unit (not shown). The supercooled fluid condenses the solvent that is drawn into the pump 28. Coupled to the pump 28 and the tank 12 is a pressure control system 30 that regulates the pressure of the cleaning fluid within the tank 12. The pressure control system 30 may have a pressure transducer connected to a proportional control valve. The transducer senses the fluid pressure within the tank or fluid line and provides an output that varies the opening of the proportional valve. For example, if the pressure is above a desired value, the control valve will open up further to increase the flowrate between the tank 12 and pump 28 to reduce the pressure within the container 12. The transducer and proportional valve may be connected to a computer that monitors the pressure and allows the user to keypunch in new pressure values. Likewise, the heating element 24 may also be connected to the computer to provide full automation of the system 10. In the alternative, the pressure control system 30 may be a simple adjustable spring loaded control valve or any other pressure control means.

The vacuum pump 28 and pressure control system 30 control the pressure of the cleaning fluid. In the preferred embodiment, the fluid pressure is subatmospheric. For purposes of reference only and without limiting the scope of the invention, atmospheric pressure will be defined as the pressure of the atmosphere at sea level. Operating the cleaning fluid at low pressures allows the operating temperature of the fluid to be reduced without inducing a phase change in the fluid. Consequently the fluid can go through a phase change at a lower temperature when at a subatmospheric pressure, or at a higher temperature at super atmospheric pressure. The decrease in fluid temperature may allow previously incompatible chemicals to be used as cleaning agent. For example, when circuit boards are defluxed and de-greased with vaporized trichloroethylene at ambient pressures, the elevated temperature of the cleaning fluid will dissolve parts of the board, particularly components constructed from plastic. It has been found that by reducing the pressure and temperature of the fluid, trichloroethylene can be used to clean circuit boards without degrading the components. Trichloroethylene is a desirable chemical because it does not deplete the ozone. The present invention thus allows the use of chemicals that are less harmful to the environment. The applicant has found that the following pressures and temperatures induce a more aggressive behavior for the corresponding cleaning fluids.

| CLEANING FLUID | TEMP (°F.) | MIN. PRESS. (In Hg) | MAX. PRESS. (psi) |
| --- | --- | --- | --- |
| Perclorethylene | 250 | 30 | 90 |
| Trichlorethylene | 180 | 30 | 60 |
| Methyl Chloride | 104 | 30 | 150 |
| Hydrochlorofluorocarbon 123 | 86 | 10 | 150 |
| Hydrochlorofluorocarbon 141b | 88 | 20 | 150 |
| Hydrochlorofluorocarbon 22 | 41.4 | 30 | 100 |
| Hydrochlorofluorocarbon 134a | 22 | 30 | 100 |
| Isopropyl alcohol | — | 30 | 20 |
| Hydrocarbon | — | 30 | 60 |

The system allows the user to decrease the saturation pressure and corresponding saturation temperature of any fluid. Although subatmospheric fluid pressures are described, it is to be understood that any fluid operating pressure can be utilized and controlled by the present invention. It may be found that increasing the pressure of the fluid above conventional operating levels will provide more beneficial results. The system therefore provides pressure control so that an effective operating temperature can be attained.

The cleaning fluid 18 flows from the tank 12, through a waste chamber 32 and into a cleaning unit 34 that removes grease and other foreign material from the fluid. The cleaning unit 34 is preferably a still that revaporizes the fluid (the fluid is typically in a liquid or liquid/vapor state when it is pulled from the waste chamber 32). The still 34 may have a filtering system that traps the foreign material, which is then stored in a waste container 36. The system may have a waste drain valve (not shown) that can terminate the flow of waste from the still 34 and allow the waste container 36 to be detached for subsequent waste removal. The cleaning unit 34 cleans the cleaning fluid 18 to allow the fluid to be recirculated back into the tank 12. Although the cleaning unit 34 is shown as separate from the tank 12, it is to be understood that the still 34 may be integral with the tank 12.

The vaporized cleaning fluid flows from the still 32 through a clean chamber 38 and into a chiller 40. The chiller 40 reduces the temperature of the cleaning fluid 18 which is then pumped back into the clean chamber 38. If a liquid ring pump is used, the pump 28 changes the fluid to a liquid state. When the cleaning fluid is pumped from the chiller 40 back into the clean chamber 38, the heat of the vaporized fluid flowing from the still 32 raises the temperature of the liquid cleaning fluid. The clean chamber 38 therefore provides a regenerative effect on the fluid. The liquid cleaning fluid is pumped back into the tank 12 by a feed pump 42. The feed pump 42 is connected to a reheater 44 which heats the cleaning fluid 18 and directs the fluid back into the tank 12. The reheater 44 can be set so that the cleaning fluid is reintroduced into the tank 12 as either a gas, liquid, or in a two-phase state.

The system may also have a preheater 45 which heats the fluid within the clean chamber 38. The vaporized fluid is typically reintroduced into the tank 12 through the first manifold 22. As shown in FIG. 1, the outlet of the feed pump 42 may also be connected to the second manifold 26 to allow fluid in the liquid state to be reintroduced into the cleaning chamber 14, preferably as a liquid spray. The pressure control system 30 contains control valves 46 which regulate the flow of cleaning fluid in and out of the tank in accordance with the pressure of the fluid within the cleaning chamber 14. The present invention therefore provides a cleaning unit that can regulate the fluid pressure and clean the fluid within a closed recirculating system.

It is sometimes desirable to evacuate the chamber 14, particularly after the object 16 has been cleaned and must be removed from the tank. It is desirable to perform this operation without releasing the vapors of the cleaning fluid into the ambient. Evacuation of the tank can be achieved by opening valve 48, shutting off the feed pump 42, and allowing the vacuum pump 28 to pull all of the cleaning fluid out of the tank 12 and into the still 34. The cleaning fluid is then stored in either the clean chamber 38 or a reservoir 50. The reservoir 50 may be adapted with quick disconnects to allow the cleaning fluid to be removed and replaced, possibly with a new chemical. In the preferred embodiment, the pump 28 pumps only vaporized cleaning fluid to the still 32. This method of evacuation insures that little solvent latent residue will remain in the chamber 14, so that subsequent cleaning of the tank 12 is simplified and accelerated. The reservoir 50 is typically constructed as a pressure vessel which has a condenser that cools the cleaning fluid for storage in a liquid state. The cleaning fluid can be resupplied to the tank 12 by closing the valve 48 and reactivating the feed pump 42. In the preferred embodiment, the pump 28 is adapted to evacuate any oxygen from the container 12 before the cleaning fluid is reintroduced to the tank 12. The removal of oxygen is particularly useful when the cleaning fluid is a flammable material.

The tank 12 may be coupled to a source of gas 70 which is used to evacuate the cleaning chamber 14. The gas source 70 is connected to a gas heater 72 and a valve 74. When the tank is to be evacuated, the value 74 is opened and the purging gas is introduced to the chamber 14 through the manifold 22. The heated gas pushes the fluid 18 out of the chamber 14. The gas flows to the liquid pump 28 which condenses and removes the solvent. The purging gas is captured by a trap 78 and released into the atmosphere. The system may have a carbon bed 76 coupled to the heat exchanger 29 by the refrigeration trap 78. The carbon bed removes any purging gas that flows into the heat exchanger 29.

FIG. 2 shows a preferred embodiment for sealing the lid 20 to the tank 14. The tank 14 may have a first seal 52 within a first groove 54 and a second seal 56 within a second groove 58. When the lid 20 is coupled to the tank 14, the seals are separated by a channel 60. A vacuum pump 62 creates a vacuum in the channel 60 and pulls the lid 20 toward the tank 14. The vacuum in the channel 60 attaches the lid 20 to the tank 14 without requiring latches or other mechanical fasteners. The vacuum pump 62 is typically connected to the tank 14, so that any vapor which leaks into the channel 60 is directed back into the cleaning chamber 14 of the tank.

While certain exemplary embodiments have been described in detail and shown in the accompanying drawings, it is to be understood that such embodiments are merely illustrative of and not restrictive on the broad invention and that the present invention not be limited to the specific arrangement and constructions shown and described, since various other modifications may occur to those ordinarily skilled in the art.

What is claimed is:

1. A cleaning system, comprising:
   a tank adapted to contain a cleaning fluid in both a liquid and vaporized state;
   a still connected to said tank;
   a condenser connected to said still;
   a first pump connected to said condenser;
   a clean chamber connected to said first pump;
   a second pump connected to said clean chamber;
   a reheater connected to said second pump and said tank.

2. The cleaning system as recited in claim 1, wherein said recirculation system further includes pressure control means for controlling the pressure of said cleaning fluid within said tank.

3. The cleaning system as recited in claim 1, wherein said first pump is a liquid ring pump.

4. The cleaning system as recited in claim 1, wherein said cleaning fluid is perchlorethylene.

5. The cleaning system as recited in claim 4, further comprising temperature control means for maintaining the temperature of said perchlorethylene at approximately 250° F.

6. The cleaning system as recited in claim 1, wherein said cleaning fluid is trichlorethylene.

7. The cleaning system as recited in claim 6, further comprising temperature control means for maintaining the temperature of said trichlorethylene at approximately 190° F.

8. The cleaning system as recited in claim 1, wherein said cleaning fluid is methyl chloride.

9. The cleaning system as recited in claim 8, further comprising temperature control means for maintaining the temperature of said methyl chloride at approximately 100° F.

10. The cleaning system as recited in claim 1, wherein said cleaning fluid is a hydrochlorofluorocarbon.

11. The cleaning system as recited in claim 10, further comprising temperature control means for maintaining the temperature of said hydrochlorofluorocarbon at approximately 90° F.

12. The cleaning system as recited in claim 1, wherein said cleaning fluid is a hydrofluorocarbon.

13. The cleaning system as recited in claim 12, further comprising temperature control means for maintaining the temperature of said hydrofluorocarbon at approximately 20° F.

14. The cleaning system as recited in claim 1, wherein said cleaning fluid is isopropyl alcohol.

15. The cleaning system as recited in claim 1, wherein said cleaning fluid is a hydrocarbon.

16. A cleaning system, comprising:
a tank adapted to contain a cleaning fluid;
a still connected to said tank;
a clean chamber connected to said still, said clean chamber being adapted to contain said cleaning fluid in both a liquid and vaporized state;
a condenser connected to said clean chamber;
a first pump connected to said condenser and said clean chamber;
a second pump connected to said clean chamber; and,
a reheater connected to said second pump and said tank.

17. The cleaning system as recited in claim 16, further comprising pressure control means for controlling the pressure of said cleaning fluid within said tank.

18. The cleaning system as recited in claim 17, wherein said first pump is a liquid ring pump that is coupled to a source of supercooled liquid.

19. The cleaning system as recited in claim 18, further comprising evacuation means for evacuating said tank with a heated purging gas that is directed into said liquid ring pump and captured by a trap.

* * * * *